(12) United States Patent
Mullen

(10) Patent No.: US 10,842,218 B2
(45) Date of Patent: Nov. 24, 2020

(54) MAXIMIZING POWER GENERATION IN AND DISTRIBUTING FORCE AMONGST PIEZOELECTRIC GENERATORS

(76) Inventor: Jeffrey D. Mullen, Pittsburgh, PA (US)

( * ) Notice: Subject to any disclaimer, the term of this patent is extended or adjusted under 35 U.S.C. 154(b) by 0 days.

(21) Appl. No.: 11/949,046

(22) Filed: Dec. 3, 2007

(65) Prior Publication Data

US 2008/0083139 A1 Apr. 10, 2008

Related U.S. Application Data

(63) Continuation of application No. 10/785,289, filed on Feb. 23, 2004, now Pat. No. 7,304,416.

(60) Provisional application No. 60/449,371, filed on Feb. 21, 2003.

(51) Int. Cl.
| | |
|---|---|
| *H01L 41/113* | (2006.01) |
| *H02N 2/18* | (2006.01) |
| *A43B 3/00* | (2006.01) |

(52) U.S. Cl.
CPC .............. *A43B 3/00* (2013.01); *A43B 3/0005* (2013.01); *A43B 3/0015* (2013.01); *H01L 41/113* (2013.01); *H02N 2/18* (2013.01)

(58) Field of Classification Search
CPC ............... H01L 41/113; H01L 41/1132; H01L 41/1134; H01L 41/1136; H01L 41/1138
USPC .................................................. 310/339, 800
See application file for complete search history.

(56) References Cited

U.S. PATENT DOCUMENTS

| | | | |
|---|---|---|---|
| 3,339,104 A | 6/1967 | Kushner et al. | |
| 3,935,485 A | 1/1976 | Yoshida et al. | |
| 4,190,785 A | 2/1980 | Kompanek | |
| 4,430,595 A * | 2/1984 | Nakasone | H03K 17/964 |
| | | | 310/339 |
| 4,633,123 A | 12/1986 | Radice | |
| 4,748,366 A * | 5/1988 | Taylor | 310/328 |
| 4,814,661 A * | 3/1989 | Ratzlaff et al. | 310/328 |
| 5,029,873 A | 7/1991 | David | |
| 5,065,067 A * | 11/1991 | Todd et al. | 310/339 |
| 5,189,332 A | 2/1993 | Wild | |
| 5,230,921 A | 7/1993 | Walton et al. | |
| 5,387,803 A | 2/1995 | Kurtz et al. | |
| 5,426,837 A | 6/1995 | Tieman | |
| 5,495,136 A * | 2/1996 | Chiang et al. | 310/339 |
| 5,500,635 A * | 3/1996 | Mott | 340/323 R |
| 5,645,743 A | 7/1997 | Fukuoka et al. | |
| 5,796,207 A | 8/1998 | Safari et al. | |
| 5,801,475 A | 9/1998 | Kimura | |
| 6,433,465 B1 * | 8/2002 | McKnight et al. | 310/339 |

(Continued)

OTHER PUBLICATIONS

Kendall, Clyde, *Parasitic Power Collection in Shoe Mounted Devices*, Department of Physics, Massachusetts Institute of Technology, May 8, 1998.

(Continued)

*Primary Examiner* — Derek J Rosenau

(57) ABSTRACT

It is an object of the present invention to array and utilize piezoelectric generators. It is also an object of the invention to implement properly configured piezoelectric generators into applications that can recapture expelled kinetic energy that is otherwise wasted. Particularly, piezoelectric generators, or arrays, may be, for example, placed in shoes, clothing, tires, roads, and sidewalks in order to recapture the energy expelled in everyday human activities (e.g., walking, moving, and driving).

20 Claims, 12 Drawing Sheets

(56) References Cited

U.S. PATENT DOCUMENTS

| | | |
|---|---|---|
| 6,597,086 B1 | 7/2003 | Boecking |
| 6,617,758 B2 | 9/2003 | Murphy et al. |
| 6,657,365 B1 | 12/2003 | Ambs |
| 6,737,981 B2 | 5/2004 | Hagemeister et al. |
| 6,777,865 B2 | 8/2004 | Rossi |
| 6,876,135 B2* | 4/2005 | Pelrine et al. ............... 310/339 |
| 6,894,460 B2 | 5/2005 | Clingman |
| 6,911,913 B2 | 6/2005 | Kim et al. |
| 6,912,759 B2 | 7/2005 | Izadnegandar et al. |
| 7,265,666 B2* | 9/2007 | Daniel .................... 340/539.11 |
| 2003/0209132 A1* | 11/2003 | Mishima ....................... 84/730 |
| 2005/0146220 A1* | 7/2005 | Hamel et al. .................. 307/44 |
| 2006/0021261 A1* | 2/2006 | Face ....................... A43B 3/00 36/132 |
| 2007/0107778 A1* | 5/2007 | Bettin et al. .................. 137/13 |
| 2011/0060535 A1* | 3/2011 | Arms et al. .................... 702/34 |

OTHER PUBLICATIONS

Kendall, Clyde. *Parasitic Power Harvesting in Shows*, Draft 2.0, Physics and Media Group, MIT Media Library, Aug. 1998.

Starner, T. *Human-powered Wearable Computing*, IBM Systems Journal, vol. 35, Nos. 3 & 4.

Shenck, Nathan S. et al., "Energy Scavenging with Shoe-Mounted Piezoelectrics," IEEE Micro, vol. 21, Issue 3, pp. 30-42, May-Jun. 2001.

* cited by examiner

MAXIMIZING POWER GENERATION IN AND DISTRIBUTING FORCE AMONGST PIEZOELECTRIC GENERATORS

CROSS-REFERENCE TO RELATED APPLICATION

This application is a continuation of U.S. patent application Ser. No. 10/785,289, filed on Feb. 23, 2004, which claims the benefit of U.S. Provisional Patent Application No. 60/449,371, filed on Feb. 21, 2003, which is hereby incorporated by reference in its entirety.

BACKGROUND OF THE INVENTION

This invention relates to piezoceramics and more particularly to piezoelectric generators. More particularly, this invention relates to beneficial applications that can be realized with properly arrayed and configured piezoelectric generators.

Piezoelectrics have two general configurations. First, a piezoelectric actuator may be constructed. Here, the piezoelectric element is physically distorted when an electric potential is placed across the piezoelectric actuator. A piezoelectric actuator may be configured to bend or stretch/compress as a result of an electric potential. Second, a piezoelectric generator may be constructed. Here, the piezoelectric element generates an electric potential when physically distorted (e.g., strained). A piezoelectric generator may be configured to generate an electric potential when the generator is bent or compressed/stretched.

Traditional piezoelectric generators generally produce small voltages. As a result, traditional piezoelectric generators are primarily utilized as sensors (e.g., strain sensors). It is therefore desirable to create piezoelectric configurations that generate a significant electric potential—a potential which may be utilized as a power supply.

Throughout the day, people expel and waste energy. For example, people waste a large amount of energy while walking. In 1995, Thad Starner estimated that 67 watts of power are available in the heel movement of an average sized person (e.g., 68 kg) walking at a brisk pace (e.g., two steps per second with the foot moving 5 cm vertically). See T. Starner, "Human Powered Wearable Computing," IBM Systems J., vol. 35, nos. 3 and 4, 1996, pp. 618-629. It is therefore desirable to recapture some of the energy wasted during everyday human activities.

Shoe-mounted Piezoelectrics have been developed. See Shenck et al., "Energy Scavenging with Shoe-Mounted Piezoelectrics," IEEE-Micro, May 2001. These traditional configurations produce small amounts of power. It is therefore desirable to create shoe-mounted piezoelectrics that are capable of generating relatively large amounts of power. It is also desirable to provide piezoelectrics that may be integrated into other types of energy-wasting devices in order to recapture and convert the wasted energy into an electrical, or useful, energy.

SUMMARY OF THE INVENTION

It is an object of the present invention to array and utilize piezoelectric/piezoelectric generators as power supplies (e.g., voltage sources). It is also an object of the present invention to integrate properly configured piezoelectric generators into applications that can recapture expelled kinetic, or other, energy—energy that would otherwise be wasted.

One or more piezoelectric arrays of generators, or generators, may be placed throughout a shoe (e.g., in the sole and/or heel of a shoe). In doing so, the kinetic energy expelled by people walking may be partially recaptured. Such energy could be stored (e.g., in a rechargeable battery) and reused for portable applications (e.g., cell phones, communications, locating devices). In this manner, devices may be powered by the normal activities of a person.

In other embodiments, a piezoelectric array is configured to be placed underneath, or in, a sidewalk or highway. In doing so, the kinetic energy expelled by people walking, or cars driving, is recaptured. Such energy may be utilized (e.g., across a load resistor) to power nearby devices (e.g., street lights, illuminated street signs, and houses).

A guide-frame may be aligned with a piezoelectric element. Such a guide-frame may be constructed such that the piezoelectric element touches the guide-frame when the piezoelectric element is displaced by its maximum displacement. Without such a guide-frame, a piezoelectric element may break if the strain is too great for the piezoelectric element to handle. In providing a guide-frame, the piezoceramic is stopped from being displaced more than its maximum displacement. Thus, a piezoelectric element can be downsized so the piezoelectric elements generates its maximum potential (e.g., is physically distorted by its maximum displacement) more frequently without breaking.

A guide-tooth may also be aligned with a piezoelectric element. A piezoelectric element may be sandwiched between a guide-tooth and a guide-frame such that when a significant force is placed on the guide-tooth (or guide frame), the piezoelectric element is distorted into the guide-frame (or guide tooth) near its maximum displacement (or a desired displacement).

Multiple instances of a piezoelectric generator may be arrayed together. For example, piezoelectric generators may be placed in both series and parallel configurations. An array may also be stacked, and aligned with other stacks, such that a single force can be utilized to distort multiple piezoelectric generators.

In including a guide-tooth or guide-frame, any force not absorbed into an array of piezoelectric generators may be used to distort an array of adjacent piezoelectric generators. In this manner, multiple guide-frames or guide-teeth may be physically connected together. In doing so, a single force may be distributed more evenly across multiple piezoelectric generators. For example, if an array consists of four piezoelectric generators and the guide-teeth (or guide-frames) are not physically connected, a large force may only be applied to one of the piezoelectric generators. In this example, only that piezoelectric generator may generate a potential and any excess force will be lost. However, if the guide-teeth (or guide-frames) are connected together then a large force on a single guide tooth (or guide-frame) may be distributed, through the connected guide-frames or guide-teeth) to the other piezoelectric generators in the array.

Springs may also be aligned with piezoelectric generators, or arrays, in order to increase the number of times that those piezoelectric elements are strained for each strain-providing force. For example, springs may be included in an piezoelectric array that is placed in a shoe. Thus, a piezoelectric array may be strained more than once (e.g., twice) each time a heel strike occurs.

More complicated embodiments of the piezoelectric arrays may be integrated into other user-wearable devices such as, for example, clothing. Piezoelectrics may therefore be integrated, for example, into pants, coats, and shirts. Power generated by such piezoelectrics may be utilized to provide electrical energy to clothing-related devices. For example, a self-heating jacket may be provided.

Advantageous piezoelectric actuators may also be constructed, and arrayed together, in accordance with the principles of the present invention.

DETAILED DESCRIPTION OF THE INVENTION

Figure 1B:
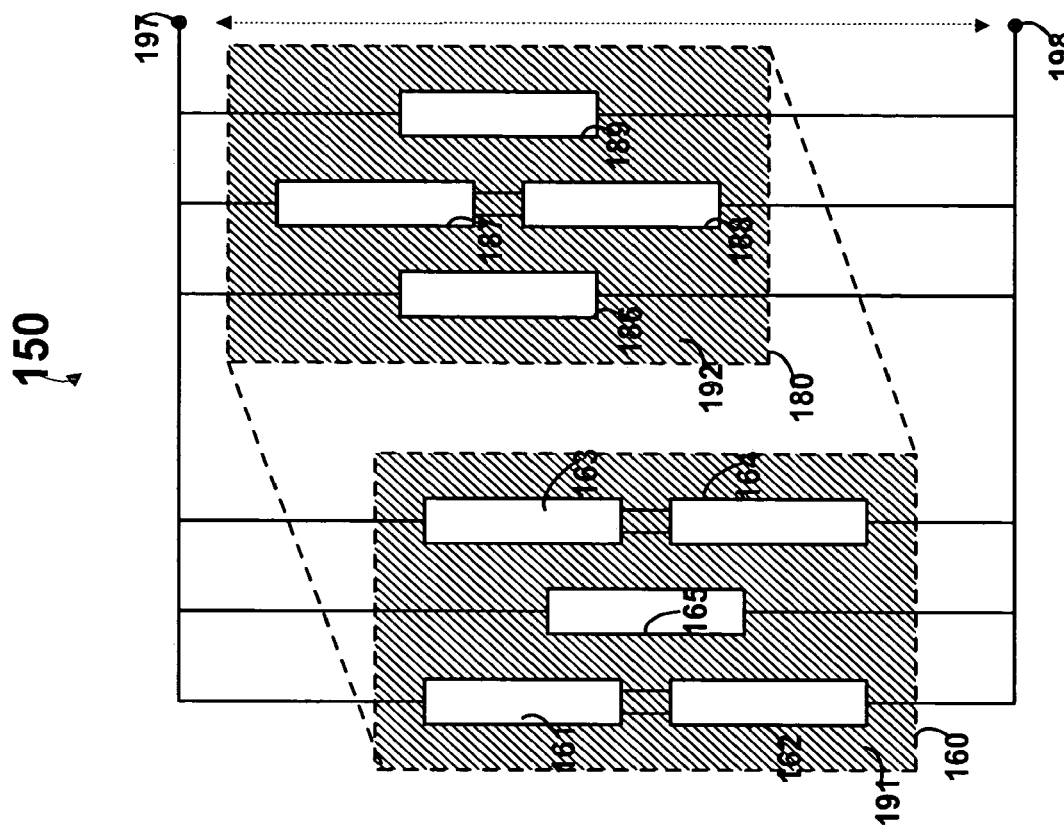
FIGS. 1A and 1B are illustrations of piezoelectric generator arrays constructed in accordance with the principles of the present invention.
Figure 1A:
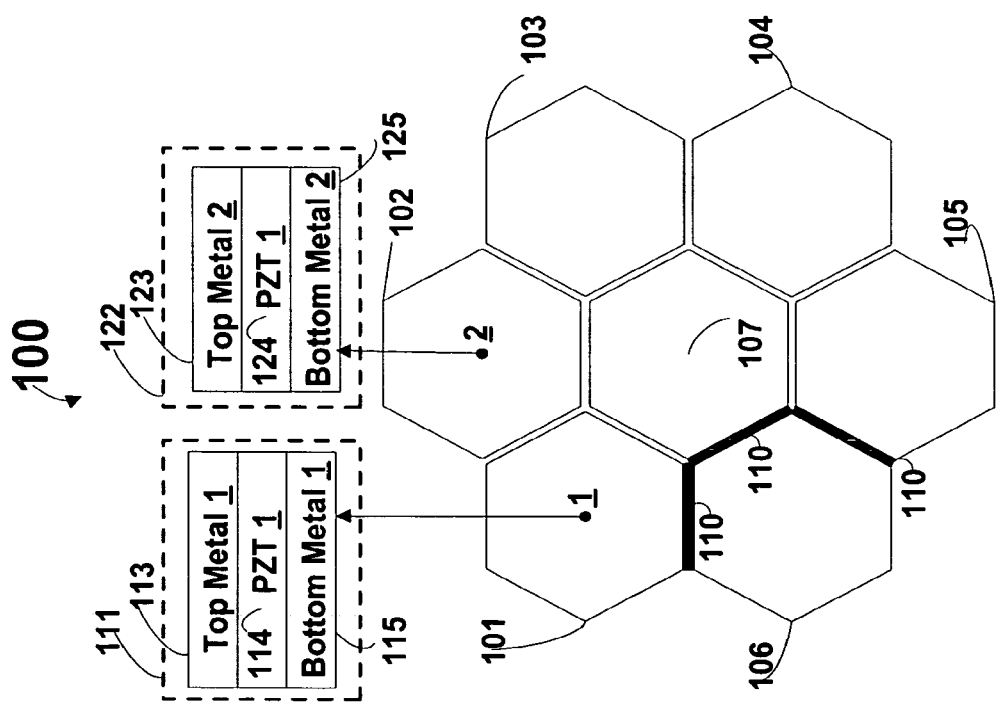

FIG. 1A shows piezo array 100 that includes a honeycomb of piezo generators 101-107. An isolation layer may be included between each of piezo generators 101-107 such that the generators are electrically isolated from each other. For example, isolation layer 110 electrically isolates piezo generator 106 from piezo generator 105. Piezo generators 101-107 may be any shape. For example, piezo generators 101-107 may be piezoelectric rectangles, squares, discs, hemispheres, stacks, and tubes.

Piezo generators 101 and 102 may take the form of configurations 111 and 122, respectively. Configurations 111 and 122 include a piezoceramic element sandwiched between two layers of metal. Preferably, the metal is flexible and merely acts as a conductive coating to the piezoceramic. In this manner, the metal layers are preferably thin when compared to the thickness of the piezoceramic element.

Although piezo generators 101-107 are isolated as a result of isolation 110, piezo generators 101-107 may be electrically coupled together in a variety of ways. For example, two or more piezo generators 101-107 may be coupled in a parallel configuration (e.g., metal 113 coupled to metal 123 and metal 115 coupled to metal 125). As per another example, two or more piezo generators 101-107 may be coupled in a series configuration (e.g., metal 113 coupled to metal 125).

Specific ones of piezo generators 101-107 may be configured to produce a voltage when bent, stretched, or compressed. For example, piezo generators 101-103 may be polarized to produce a voltage when mechanically compressed (e.g., vertically compressed or horizontally stretched) while piezo generators 104-107 may be polarized to produce a voltage when mechanically bent. Such a construction may be useful in particular applications. For example, such a construction may be utilized in the sole of a shoe. In this manner, the front of the sole is compressed when the foot strikes while the middle of the sole is bent as the foot pivots and rotates.

Persons skilled in the art will appreciate that there are multiple ways to fabricate a piezoceramic that creates an electrical voltage when bent. In one method, two compressing piezoceramics are stacked together. However the piezoceramics are polarized in opposite directions. Thus, when an electric potential is applied to the stack, one piezoceramic compresses while the other one stretches. As a result, the stack bends. When such a stack is mechanically bent the same way, an electric potential is created across the stack (or a portion of the stack). A single piezoceramic layer may also be polarized to create an electrical potential when bent. Additionally, a piezoceramic that compresses may be attached to a substrate with a particular stiffness such that the piezoceramic bends when an electric potential is applied to its electrodes. Thus, a piezoceramic may be constructed to generate a voltage differential across its electrodes when the piezoceramic is bent.

In this manner piezo elements 114 and 124, or any piezo elements taught herein, may be either a single layer element or a multiple layer element. For example, piezo 114 may be two oppositely polarized piezo elements stacked together that generates a potential across metal 113 and 115 when bent. Piezo 114 may alternatively be, for example, two piezo elements stacked together with the same polarization such that a potential is generated across metal 113 and 115 when compressed.

Multiple piezo arrays 100 may be stacked together. FIG. 1B shows stack 150 in which piezo array 160 stacked on top of piezo array 180. Each piezo array 160 and 180 preferably includes multiple piezo generators. As illustrated, piezo array 160 includes piezo generators 160-165 and piezo array 180 includes piezo generators 186-189. Arrays 160 and 180 may be stacked in a variety of ways. Arrays 160 and 180 may be stacked such that a piezo generator in array 160 aligns with a piezo generator in array 180. As show, however, each piezo generator array 160 does not completely align with a piezo generator of array 180. For example, piezo generator 165 is aligned underneath a portion of piezo generator 187 and a portion of piezo generator 188. As a result, the overall area of stack 150 that includes partially aligned piezo generator arrays is 1) easier, in at least some portions, to bend/compress/stretch; and 2) larger then a stack where the piezo generators are completely aligned.

Like array 100, stack 150 includes isolation 191 and 192. A flexible isolation 191 and 192 may be utilized to provide a variety of applications. For example, if stack 150 included bending piezo generators then isolation 191 and 192 may be a fabric. Furthering this example, the isolation 191 may be one or more layers of a fabric such as, for example, denim or cotton. Thus, stack 150 may be provided in denim or cotton based clothes. Placing a flexible stack 150 at the knee joints of Jeans would allow a second method to recapture the energy exerted during walking.

Simple versions of stack 150 may be utilized as a sensor in a fabric instead of a power source. Such sensors could be placed, for example, in football jerseys or in football equipment such that the impact of tackles may be recorded and displayed to a television viewer. As per another example, the top of a tent, or the wing of a plane, could include a number of small (e.g., on the micron level) of stacks 150 in order to determine the amount, or impact power, of rainfall/snow/hail.

It may be beneficial to no utilize flexible isolation 191 and 192 as isolation whatsoever. A simple coating of isolation (e.g., a non-conductive polish or glue) may be placed (e.g., painted) around each piezo generator. Flexible isolation 191 and 192, however, may still be useful in stack 150. Particularly, flexible isolation 191 and 192 may protect the piezo generators from receiving stress past their tensile strength (e.g., the stress at which the piezoceramic would break). The flexibility of isolation 191 and 192 and the piezo generators may be chosen such that the piezo generators may compress/bend, but that isolation 191 and 192 will bend if the stress reaches a particular point. For example, suppose flexible isolation 191 and 192 is denim. The flexibility of the denim may be chosen such that it is slightly greater than the flexibility of the piezo arrays. Thus, the piezo arrays may bend before the denim bends. However, if a large stress is applied to the denim, the denim may preferable begin to bend and reduce the amount of stress on the piezo generators.

The piezo generators of stack 150 may be coupled in a variety of ways. As shown, piezo generators are coupled in multiple series configurations and these series configurations are then configured in a parallel configuration to create a potential across nodes 197 and 198. Other electrical components (e.g., diodes, transistors, capacitors, inductors) may be coupled to the piezo generators to improve the operability of stack 150, which is discussed in greater detail in conjunction with FIG. 3.

Figure 2:
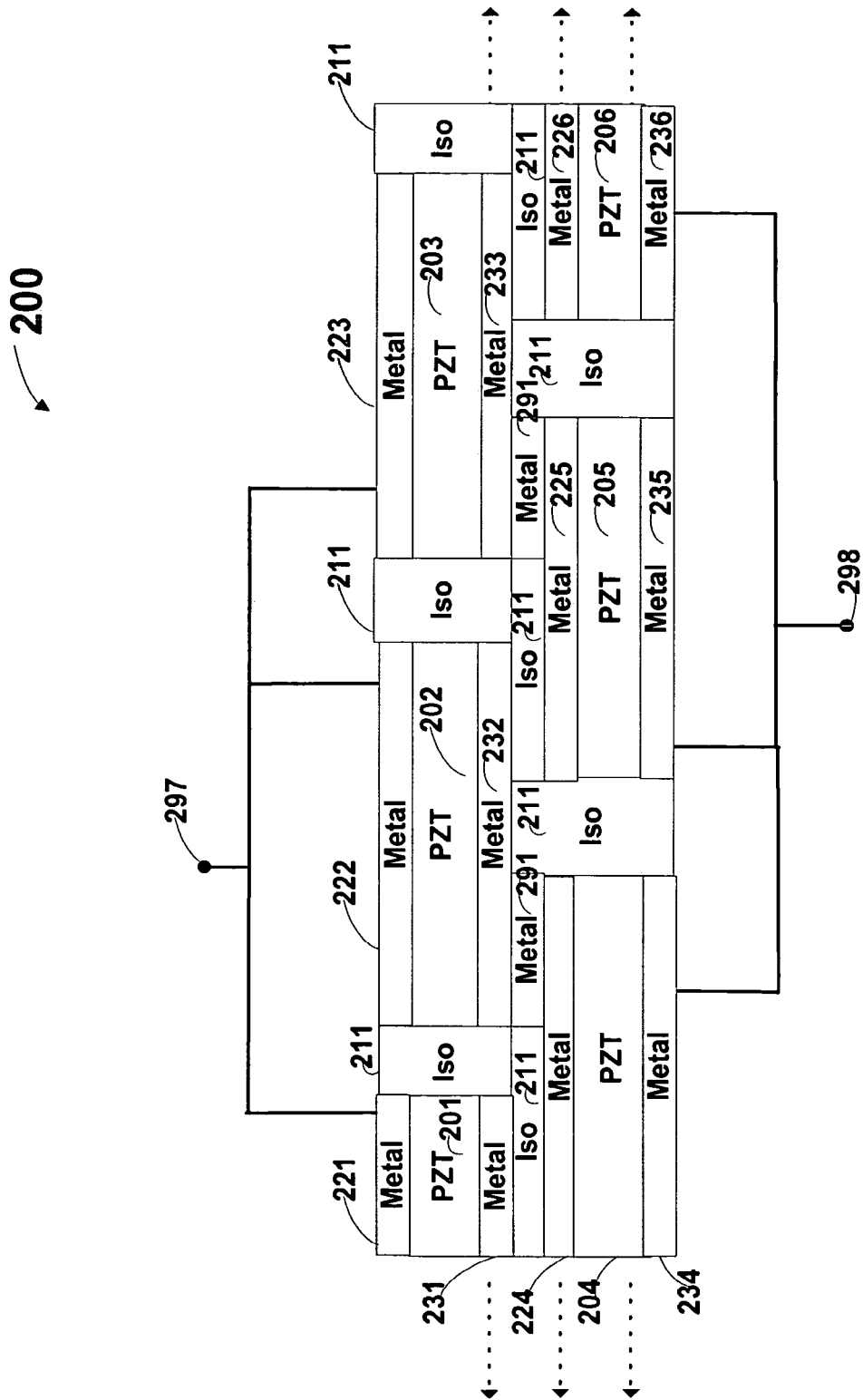
FIG. 2 is an illustration of a stack of piezoelectric generator arrays constructed in accordance with the principles of the present invention.

Looking at FIG. 2, piezo stack 200 is depicted that includes a stack of two piezo generator arrays. The piezo arrays of FIG. 2 are in a different configuration then the arrays of FIG. 1. The first array includes piezo generator 201-203 separated by isolation layers 211. Piezo generators 201-203 are coupled to metals 221-223 and 231-233, respectively. The second array includes piezo generators 204-206 separated by isolation layers 211. Piezo generators 204-206 are coupled to metals 224-226 and 234-236, respectively. In this embodiment, an intermediate metal layer 291 is included between the two arrays and provides a series connection between piezo generators 202 and 204 and between piezo generators 203 and 205. Terminal 297 is a common node to metal layers 221-223 while terminal 298 is a common node to metal layers 234-236. Thus, terminals 297 and 298 provide a parallel configuration between the two series configurations (i.e., the 202/204 configuration and the 203/205 configuration).

Stack 200, as illustrated, is a non-aligned stack. In this manner a downward stress placed on piezo generator 202 may be transferred to piezo generators 204 and 205. Persons skilled in the art will appreciate that stack 200 may be an aligned stack such that piezo generator 204 is aligned entirely beneath piezo generator 202. The piezo generators of each array (or any piezo generator) may be of different sizes. For example. Piezo generators 204-206 may have a smaller length, width, or height then piezo generators 201-203. Doing so would change the flexible nature of stack 200. Persons skilled in the art will also appreciate that stack 200, or any stack/piezo of the present invention, may be fabricated on a variety of scales. For example, stack 200 may be constructed on the meter scale and placed underneath a highway. Alternatively, stack 200 may be constructed on the micron level and placed inside the sole of a shoe.

Figure 3:
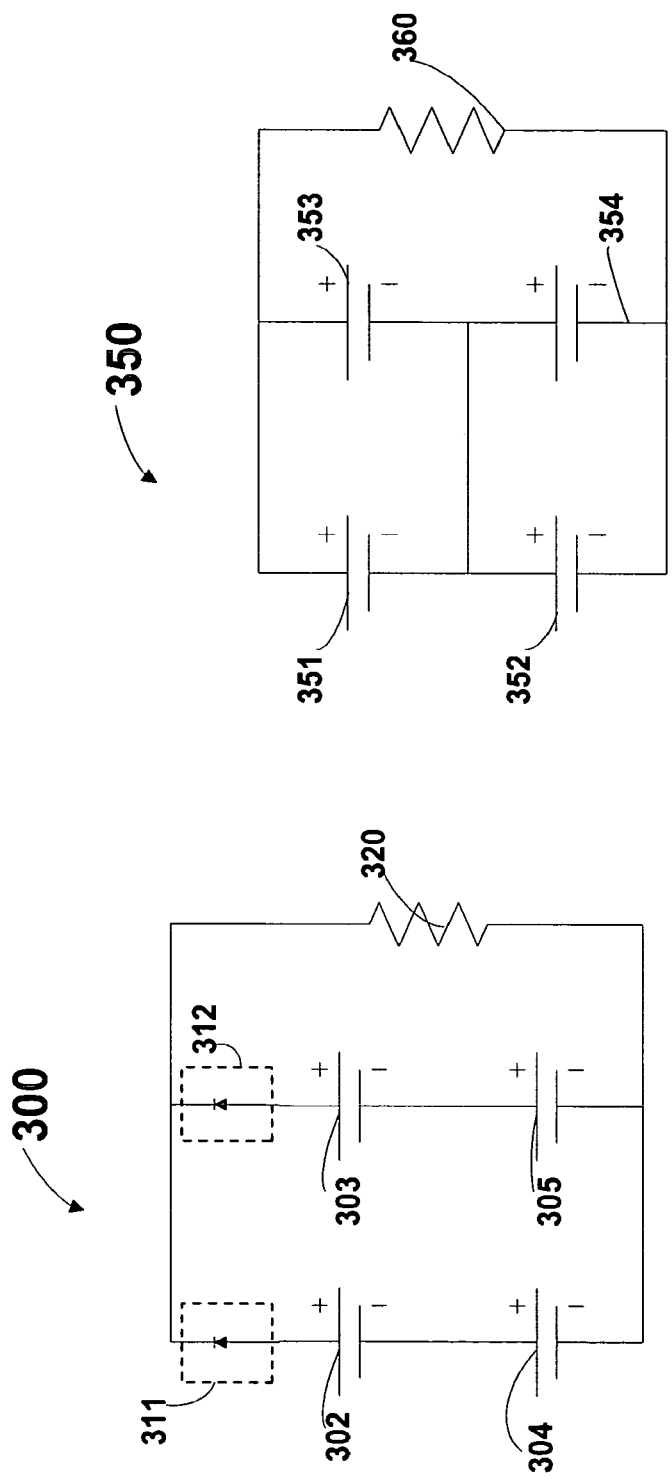
FIG. 3 is illustrates two schematics of an array of piezoelectric generators constructed in accordance with the principles of the present invention.

FIG. 3 includes circuit 300 and circuit 350. Circuit 300 shows the electrical component equivalent to a portion of piezo stack 200 of FIG. 2 when every piezo in that portion of the stack is generating a potential. Particularly, voltage sources 302-305 correspond to piezo generators 202-205 of stack 200 of FIG. 2, respectively. Load resistor 320 may be utilized to power a load from the potential created by circuit 300.

Additional circuitry, such as diodes 311 and 312, may be included in circuit 300. These diodes may be included to prevent a potential generated by one of the series configurations (e.g., piezo generators 302 and 304) to physically distort piezo generators electrically coupled to it (e.g., series configuration of piezo generators 303 and 305) if strain is not presented (e.g., no potential is created) by these nearby generators (e.g., piezo generators 303 and 305).

Looking at circuit 350, the electrical equivalent of a portion of piezo stack 200 of FIG. 2 is shown if the portions of isolation 211 between metal 232 and 225 of FIG. 2 are removed. Here, voltage sources 351-354 also correspond to piezo generators 201-204 that are generating an electric potential. The potential created by circuit 350 may be utilized to power load 360.

Figure 4:
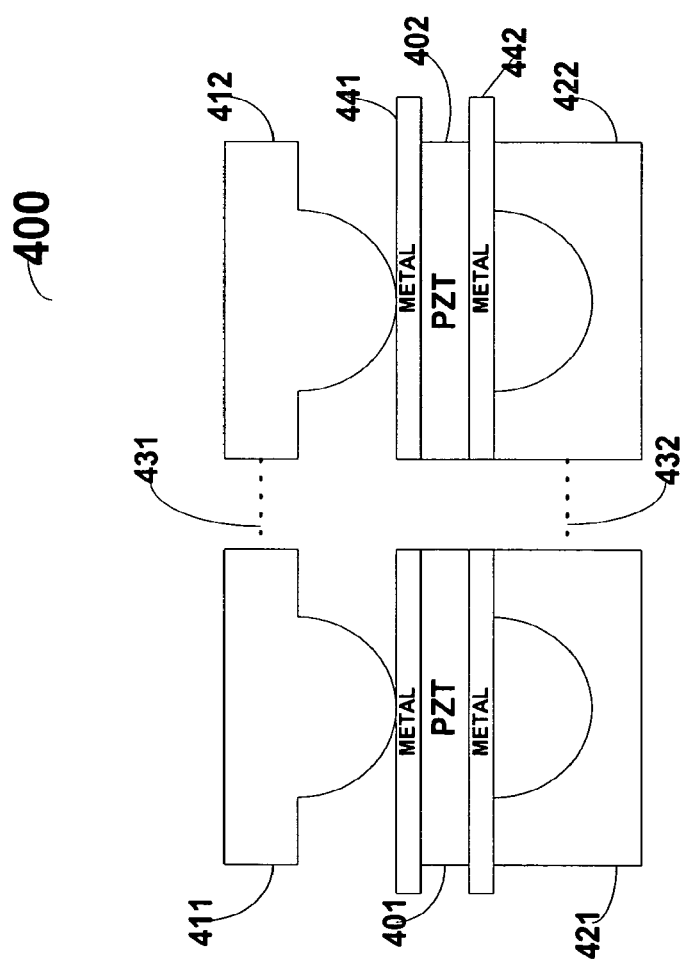
FIG. 4 is an illustration of a piezoelectric generator array employing guide-teeth and guide-frames constructed in accordance with the principles of the present invention.

Turning now to FIG. 4, array 400 is shown that includes guide-teeth 411 and 412 and guide-frames 421 and 422 for piezo generators 401 and 402. The curvature of both guide-teeth 411 and 412 and guide-frames 421 and 422 may be constructed such that if guide-teeth 411 and 412 are pressed substantially inside of guide-frames 421 and 422 then piezo generators 401 and 402 would be substantially maximally physically distorted without breaking. Guide-teeth 411 and 412 and guide-frames 421 and 422 may be physically coupled together across about, for example, lines 431 and 432, respectively. Metal layers 441 and 442 and isolation layers (not shown) may be included if a parallel or series configuration is desired. In physically connecting guide-teeth and guide-frames, a single force about one piezo generator may be distributed among several piezo generators. Array 400 may also, for example, be stacked.

Figure 5B:
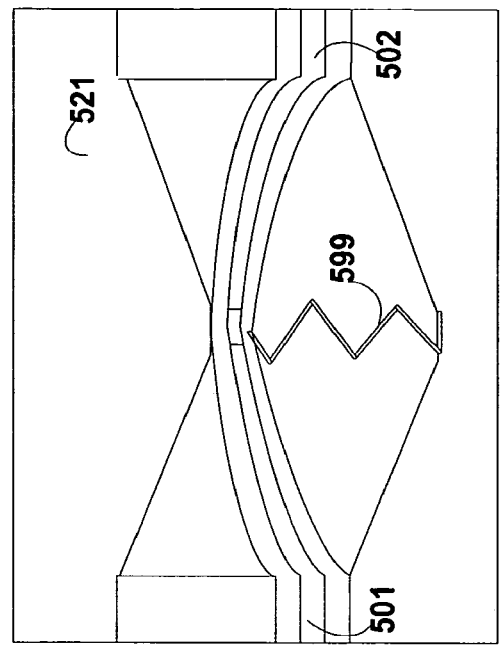
FIG. 5A and 5B are illustrations of embodiments of a piezoelectric generator employing a guide-tooth and guide-frame constructed in accordance with the principles of the present invention.
Figure 5A:
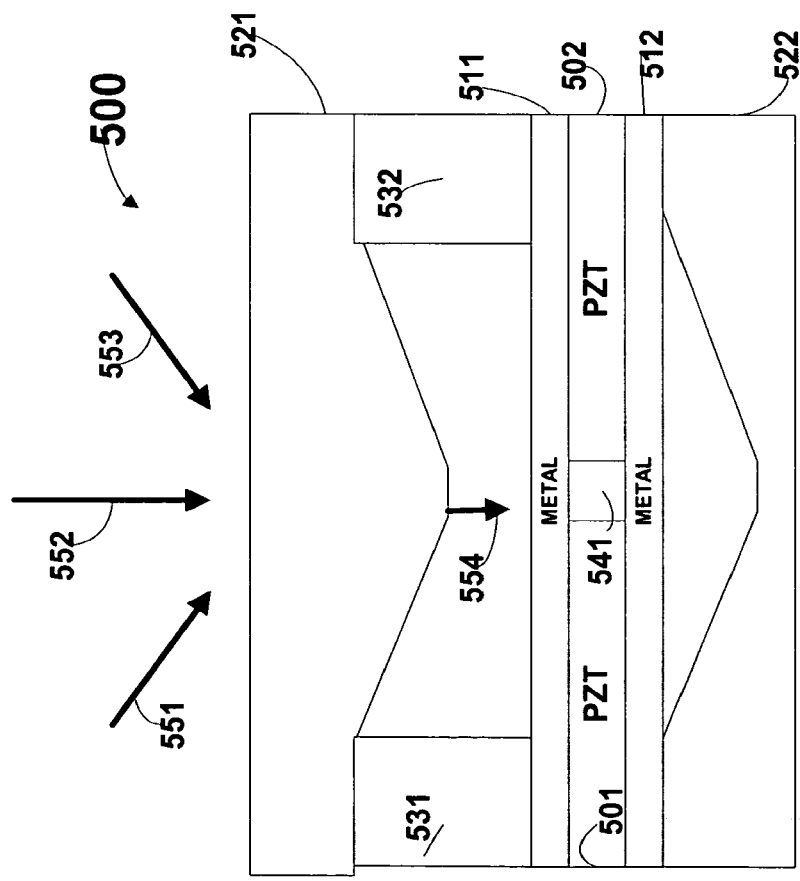

Looking at FIG. 5A, a single piezo generator 500 is shown that includes two piezo generators 501 and 502. Piezo generators 501 and 502 are polarized so that when they are physically distorted by guide-tooth 521 along force 554 and into guide-frame 522 (due to, for example, any one of forces 551, 552, and 553), piezo generators 501 and 502 create the same polarity of potential across metal layers 511 and 512. Piezo generators 501 and 502 may be isolated by isolation layer 541. Multiple generators 500 may be coupled together (or stacked together) to form a generator array.

Persons skilled in the art will appreciate that an array of piezoelectric generators can be constructed to have a certain flexibility and that this flexibility may be beyond the flexibility of any of the piezoelectric elements in the array. Particularly, if each piezoelectric generator is spaced far apart, a bending force will be more likely to bend the isolation material separating the piezo generators than the actual piezo generators themselves (if the stiffness of the isolation is less than the stiffness of the piezo generators). However, after the array is bend past a certain point, tension in the isolation layer may lower any further flexibility of the isolation layer to a point where the piezo generators bend. Thus, you can control when a piezo ceramic element in an array fully bends by controlling the stiffness, and amount, of isolation between the elements. In this manner, if the isolation layer is incredibly stiff, than any bending force will most likely result in bending of the piezoelectric generators. Thus, a force may be further channeled and controlled.

By increasing the flexibility of an array, new applications may benefit from piezoelectric technology. For example, a flexible array of piezoelectric generators constructed in accordance with the principles of the present invention may be implemented into clothing. Patches of arrays may, using the above principles, be constructed such that the piezoelectric elements of the arrays bend only when the patch is bent a certain amount. Thus, you can create HIGH bend patches (arrays where the piezos only bend when the array is bent at a LARGE amount and LOW bend patches (arrays where the piezos only bend when the array is bent at a SMALL amount. Thus, a jacket could become a personal generator where the elbows and underarms contain HIGH patches and the shoulders contain LOW patches.

Turning now to FIG. 5B, spring 599 is included in a piezo generator which may be, for example, identical to piezo generator 500 of FIG. 5A. Spring 599 is preferably constructed and integrated into array 550 such that spring 599 is extended to bend piezo generators 501 and 502 when no force is exerted upon frame 521. Thus, a single downward force 552 that is pressed on, and released from, frame 521 will bend piezo generators 501 and 502 not once, but at least twice. Additional circuitry may be included to convert the different polarities of potential generated by piezo generators 501 and 502 moving down and then back up into a potential of a single polarity. Alternatively, such an embodiment could be utilized to power an AC circuit. Alternatively still, two loads (e.g., batteries) may be included to store the energy of a specific polarity. Circuitry may be coupled to generator 550, or multiple generators 550 arrayed together, to determine the polarity of energy generated and control switching elements (e.g., transistors) that may couple a particular load (e.g., battery) to generator 550.

Figure 6:
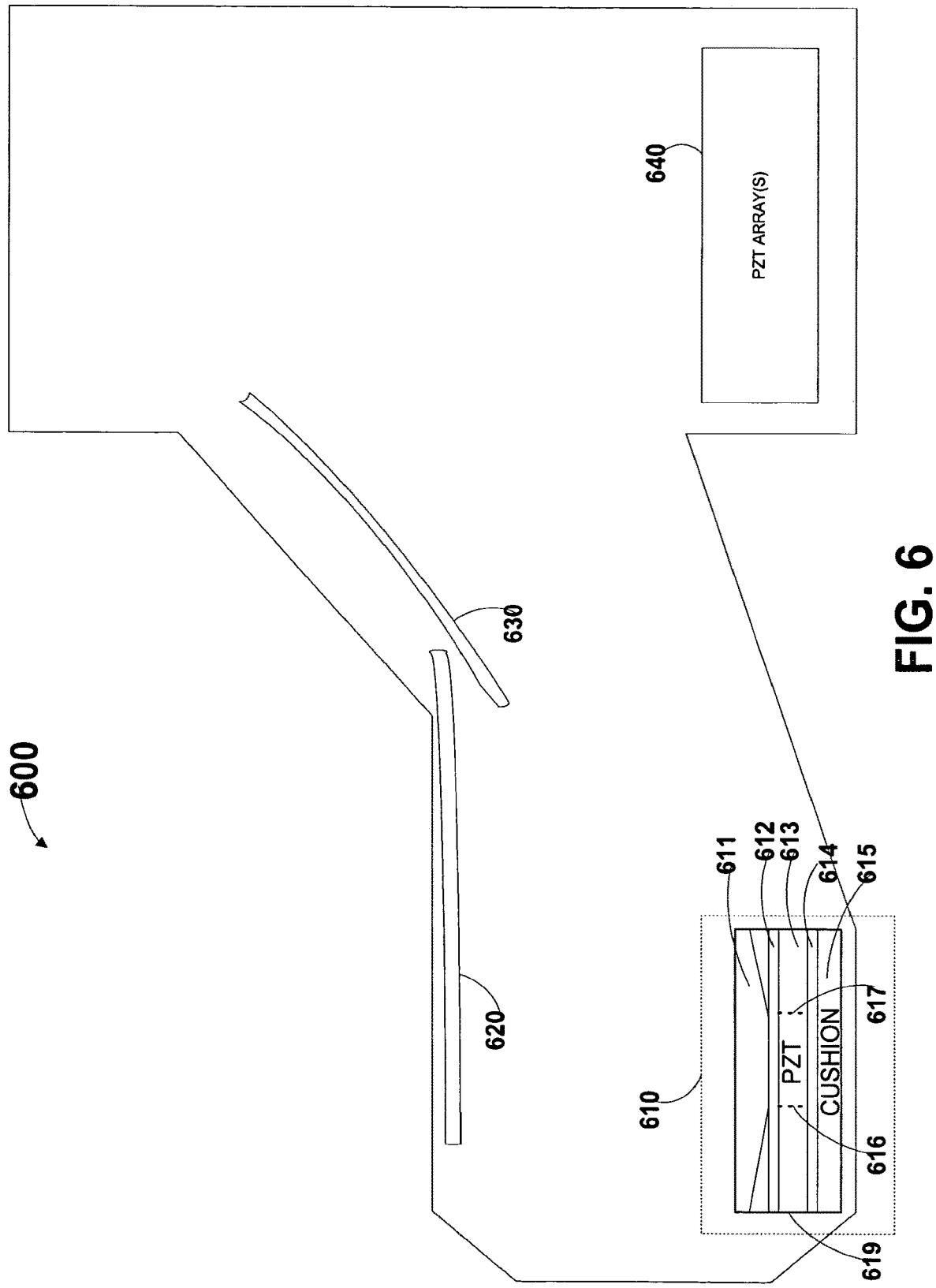
FIG. 6 is an illustration of a piezoelectric shoe constructed in accordance with the principles of the present invention.

FIG. 6 shows shoe 600 that includes multiple piezo generator arrays. Particularly, shoe 600 may include any number of arrays 610, 620, 610, and 640 located in a variety of positions within shoe 650. For example, shoe 650 may include bending piezo arrays 620 and 630 on the top of the shoe such that as a person walks, piezo arrays 620 and 630 bend. All or portions of arrays 620 and 630 may overlap. Array 610 may be included in/about the sole of the shoe. Such an array may be a compression/stretch array, a bending array, or a combination of both.

For example, array 610 may include multiple generators 619. Generator 619 may be any generator taught herein. As illustrated, generator 619 operates different than the previous generators taught herein. Particularly, generator 619 includes a guide-tooth 611, metal layer 612, piezoceramic 613, metal 614, and cushion 615 (which replaces the function of a guide-frame). Here, the piezoceramic is bent when a downward force is placed on guide-tooth 610. Cushion 615 partially includes the functionality of a spring such that when a force is removed from guide tooth 611, piezoceramic 613 straightens. In this manner, piezoceramic 613 may be affixed to metal 614 (e.g., by glue) and metal 614 may be affixed to cushion 615 (e.g., by glue). Metal layers do not necessarily have to be metal—any conductive material may be utilized.

Piezoceramic 613 may be included as three separate, and locally isolated, piezoceramics. These three piezoceramics are defined by lines 616 and 617 (the metal layers may accordingly be separated and locally isolated from one another). Persons skilled in the art will appreciate that even though these three piezoceramics are initially isolated, the three components may be electrically coupled in any configuration (e.g., a series or parallel configuration). The isolation between the three piezoceramics may have a combined length to take into account the gain in length the piezoceramic, defined between lines 616 and 617, may take on when fully stretched (e.g., a downward force on tooth 611 would compress the height and increase the length of the piezoceramic defined between lines 616 and 617. Thus, the piezoceramic defined between lines 616 and 617 may be polarized to be a compression/stretching piezoelectric. The piezoceramic defined to the left of line 616 may be polarized to create a particular polarity of voltage when bent in accordance with the portion of guide-tooth 611 to the left of 611. The piezoceramic to the right of line 617 may be configured similarly to the piezoceramic to the left of line 616 and may be polarized in a manner that creates the same polarity of voltage when bent.

Piezoelectric generator array 640 may be utilized in the heel of shoe 600. Piezoelectric array 640 may be similar to any piezoelectric array taught herein. Preferably, the piezoelectric arrays of shoe 600 will take advantage of the type of force that is applied to each portion of shoe 640. For example, the top of the shoe may include bending arrays. The sole of the shoe may include a combination of bending and compression/stretching arrays. The heel of the shoe may include compression/stretching arrays. Arrays properly matched for a particular portion of shoe 600, or any structure/device, will preferably increase efficiency and power generation. Persons skilled in the art will appreciate that stretching/compression piezoceramics exhibit different attributes, such as potential generation, for a particular force as bending piezoceramics.

Figure 7:
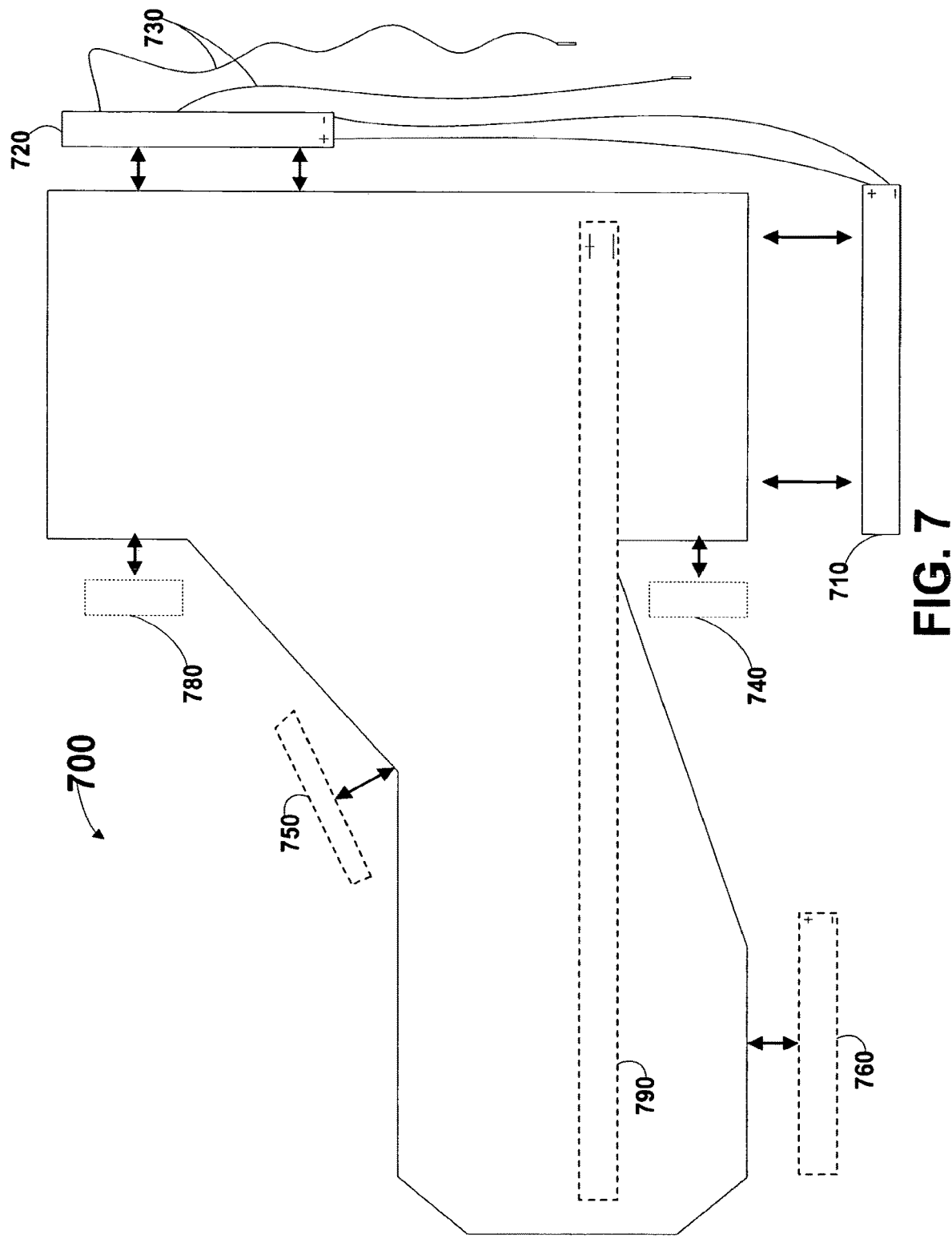
FIG. 7 is an illustration of piezoelectric shoe with a removable piezoelectric generator array constructed in accordance with the principles of the present invention.

FIG. 7 shows shoe 700 without mountable piezoelectric arrays. Piezo array(s) 710 may be provided that may be mounted to the heel of a conventional shoe or boot. Alternatively, array 710 may be fabricated as a heel to a shoe/boot such that a traditional heal may be removed and replaced with array 710. Person skilled in the art will appreciate that the bottom of array 710 may include an exterior layer that is similar to those found on the bottoms of traditional heals. Array 710 may include internal circuitry (e.g., an internal regulation, switching, and power storage system) and/or may be coupled to external circuitry 720. External circuitry 720 may simply be a battery. Alternatively, external circuitry may include switching, regulation components, and/or power storage components. External circuitry 720 or array 710 may include power input/output terminals such that other devices may be coupled to array 710 or external circuitry 720. Power input terminals may be useful if external circuitry 720 includes circuitry that requires power to operate (e.g., a GPS receiver, communications transmitter, heater). Alternatively, input terminals may be useful to depolarize the piezoelectric generators if the generators become un-polarized. Generators may become un-polarized, for example, at extreme temperatures or the presence of extreme potentials/electric fields. Circuitry/battery 720, or array(s) 710, may be attached to shoe 700 in a variety of ways. For example, shoe strings 730 may be utilized to attach to a shoe. Alternatively, Velcro strips may be used. Alternatively still, array 701 and/or circuitry 720 may be included in a slipper that fits over/around shoe 700. Such a slipper could allow for piezo generators to be placed in numerous areas around shoe 700. For example, one or more piezo generator arrays may be placed in positions 750 or 760 while circuitry is placed at position 740 or 770. Alternatively, the shoe-slipper may be utilized as a foot-slipper (i.e., a sock) in order to increase the number of shoes that the slipper is compatible with.

Piezo generators and/or external circuitry may be placed inside of a shoe. For example, piezo generators and circuitry may be placed in one or more shoe inserts 790. Array and/or circuitry placed in position 760 may be attached to the sole of a shoe or may be utilized as a replacement to the sole of a shoe.

Figure 8:
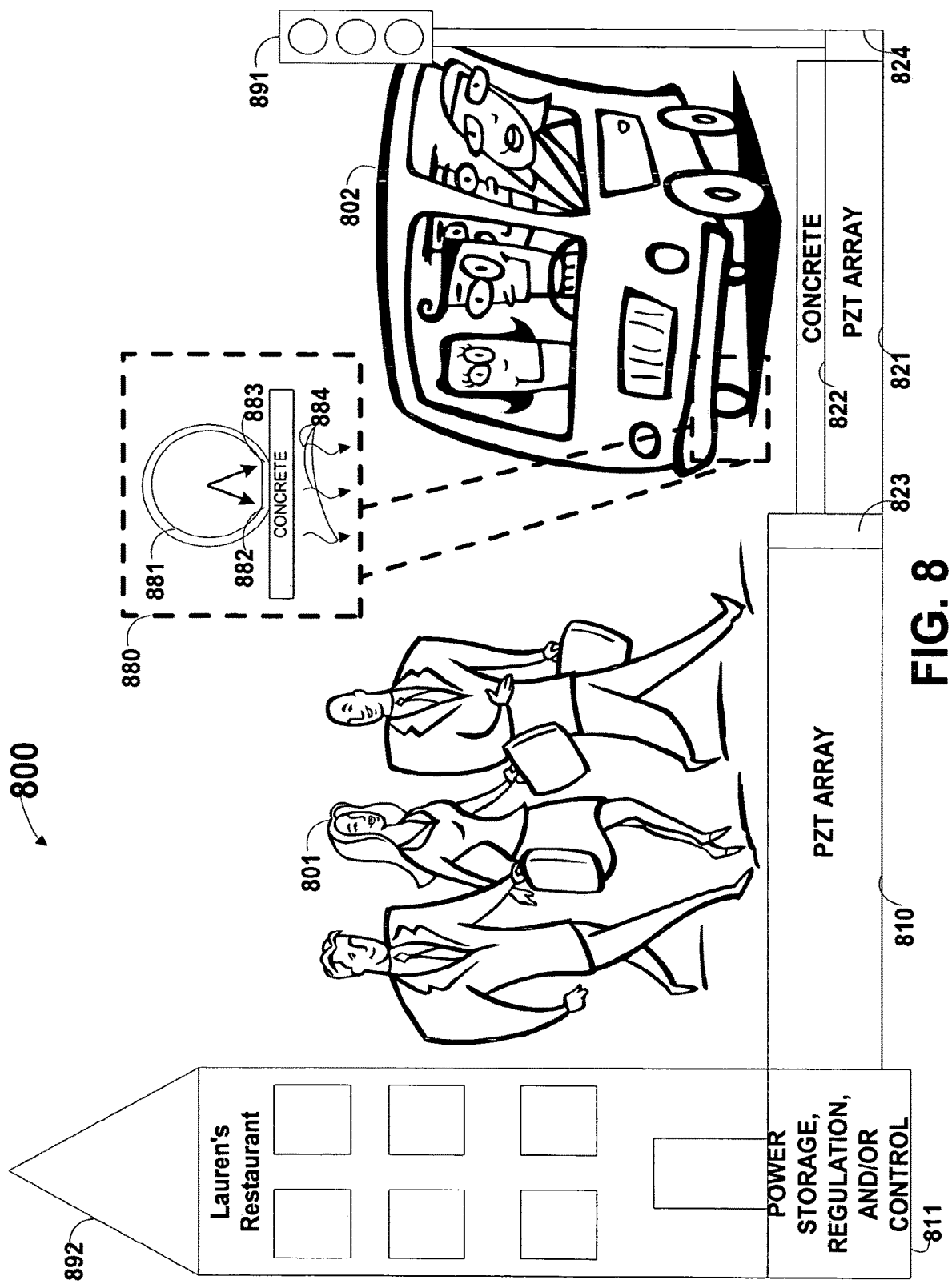
FIG. 8 is an illustration of multiple piezoelectric generator array applications constructed in accordance with the principles of the present invention.

FIG. 8 shows environment 800 that integrates piezo generator arrays in a variety of structures order to exemplify a variety of useful applications. For example, piezo array(s) 810 may be utilized as, or underneath, a sidewalk. Thus, the impact force of people 801 may be utilized to create an electrical potential that could fully, or partially, power a variety of devices (e.g., buildings 802 or devices 891 such as street lights). Array(s) 810 may be coupled to a variety of electrical energy storage, regulation, and/or control devices 811. Devices 811 may also include circuitry that switches between array 810 (or, preferably, a power storage device storing energy created from array 810) and a secondary power source (e.g., a commercial power grid).

Persons skilled in the art will appreciate that the present invention generally relates to recapturing energy wasted in trivial activities (e.g., walking and driving). In this manner, energy recapturing devices do not have to be based on piezoelectric technology. For example array 810 may be a small air tunnel while device 811 is a small electric energy generating turbine. When the air tunnel is compressed, air will travel through the turbine and, as a result, turn the turbine to create an electric energy. Such air-based technology could easily be integrated into a shoe, or clothing, the same way a piezo array 810 is integrated into, or beneath, a sidewalk.

Similar to array 810, piezo array 821 may be utilized as, or beneath, a traditional road. In this manner the vibrations created by cars 802 driving, or people walking, on the road may be converted into an electrical energy. Such an electrical energy may be utilized for power generation or electrical sensing. Array 821 may be utilized as a road or may be included beneath, between, road components (e.g., concrete 822). Circuitry 824 may be similar to circuitry 824. Piezo array 821 may also be electrically coupled to array 810 via electrical coupling 823. Coupling 823 may include any of the circuitry included in, for example, circuitry 811.

Piezo arrays may be utilized in a variety of other applications. For example, piezo arrays may be utilized in/on wheel environment 880. Particularly, piezo array(s) may be utilized in/on wheel 881. Wheel 818 physically distorts (as shown by arrows 882 and 883)as it rotates on the ground due to the weight of the car and any additional weight. A piezo array may be placed in/on wheel 881 to take advantage of this distortion. Wheel distortion may be utilized as an efficient source of power generation due to the number of times per second a wheel turns. In this manner, energy expelled by the movement of a car may be recaptured at least twice, through distortions 882 and 883 and vibrations 884.

Piezo generators, or arrays, may also be utilized as sensors. Such sensors could determine the distance traveled or when tire air pressure rapidly changes (e.g., piezoelectrics may detect a flat tire). Piezo generators, or arrays, may also be placed throughout a car to determine the strength (which can translate into speed) and direction of an impact. In this manner, piezo generators, or arrays, may be coupled to an amplifier, a control circuit, and a memory device. Doing so would create an economical "black box" for a car that could be utilized to recreate an automobile accident. Other signals (e.g., audio signals captured by a microphone, visual data captured by a still or video camera, speed data captured by an odometer, and positioning data captured by a locating device such as a GPS system) may also be recorded by such a "black box."

Figure 9:
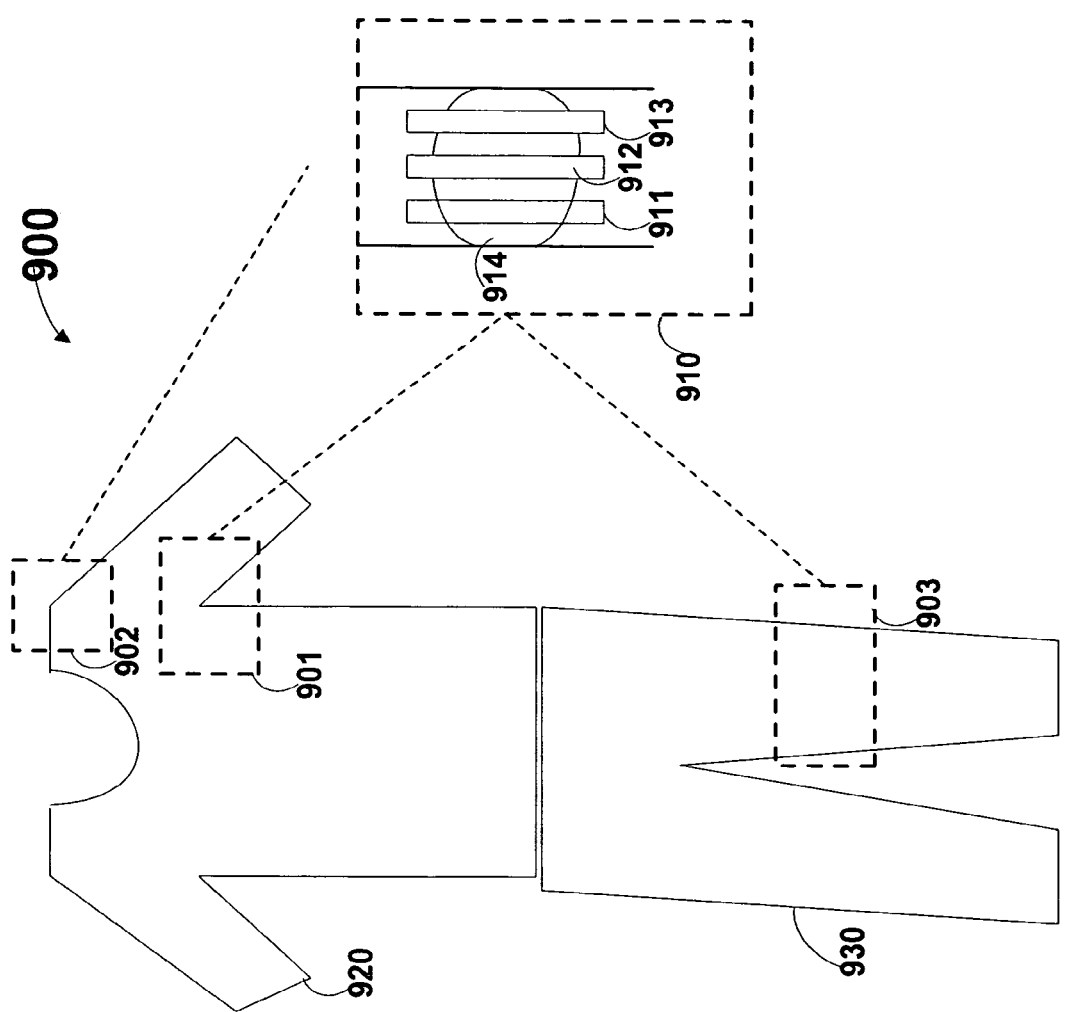
FIG. 9 is an illustration of piezoelectric generators integrated with clothing constructed in accordance with the principles of the present invention.

FIG. 9 shows clothing 900 embedded with piezoelectric generators or arrays. Shirt 920 and pants 930 are illustrated in FIG. 9. Other types of clothing may integrate piezoelectrics in accordance with the principles of the present invention. For example, coats, long sleeve shirts, shorts, and socks may integrate piezoelectrics. Such piezoelectrics may include piezo generators and/or arrays of the present invention. For example, clothing 900 may include piezoelectrics 910 situated above high-mobility areas of clothing 900. Particularly, piezo generators/arrays 911, 912, and 913 may be situated above all, or a portion of a joint (e.g., upper shoulder joint 902, lower shoulder joint 901, and front knee joint 903). Examples of other joints that may be utilized included the back of the knee joint 914 (e.g., the portion of pants 930 on the side directly opposite portion 903). The shoulder bones (e.g., portions of the back), elbows, wrists, or any other portion of clothing 900 that would physically distort when moving.

Piezo generators/arrays with a relatively LOW rigidity (e.g., HIGH flexibility) may be placed in portions of relatively LOW probably mobility/stress (e.g., on joints) while generators/arrays with a relatively HIGH rigidity (e.g., LOW flexibility) may be placed in portions of probably HIGH mobility/stress (e.g., around joints). The same concept may be utilized in shoes or any other application of the present invention. Generally, rigid/stiff piezoelectrics generate more potential then a less rigid/stiff piezoelectric (operates under the principle that more energy is needed to distort a more rigid/stiff object than one that is less rigid/stiff). The area of clothing near a shoulder bone, for example, may be distorted with less strength then the area of clothing near a knee joint. The above area-matching scheme based the level of mobility/stress better matches piezoelectrics to particular portions of an application such that energy is preferably generated at a more constant rate.

Piezo arrays may be fabricated for clothing 900, or any other application, on a small scale (e.g., a micro-meter scale). Doing such may allow the piezo arrays to generate a voltage in even the smallest movements (e.g., a human breathing may stretch/compress/bend a piezo array to generate an electrical potential). Such voltages may be utilized for sensing or to power an electrical device (e.g., a battery or processor). Alternatively, electrical potentials may be applied to any piezo array (e.g., the piezo arrays in clothing 900) in order to mechanically distort the clothing. Such applications could be useful for massage techniques (e.g., a back massager) or for human strength enhancement techniques (e.g., in a wetsuit to increase the speed a person may swim by including piezos at the joints that are mechanically distorted for a set period or when the beginning of a joint movement is sensed by, for example, a processor).

Figure 10:
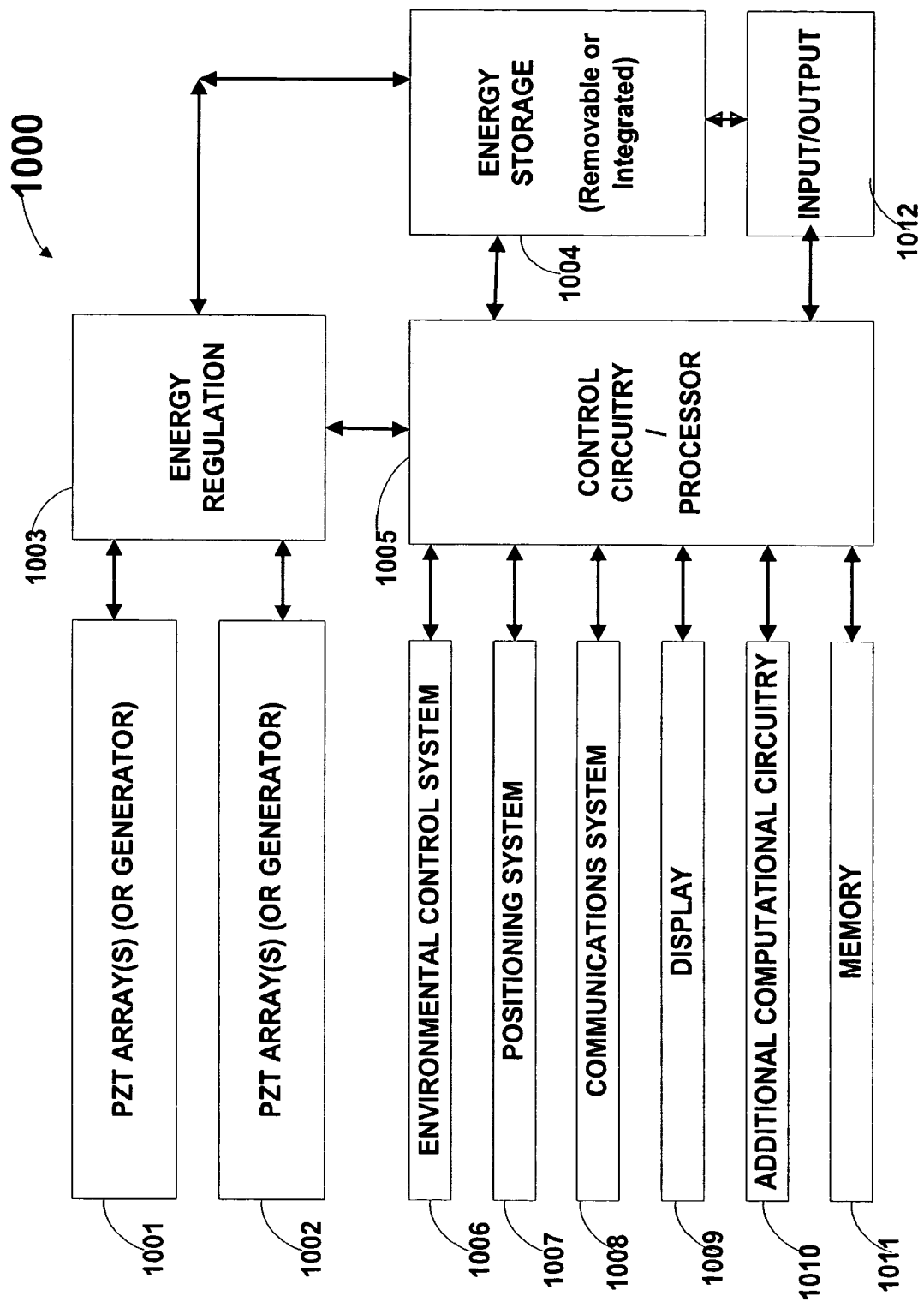
FIG. 10 is a topology of electrical systems that may be utilized with a piezoelectric generator array constructed in accordance with the principles of the present invention.

FIG. 10 illustrates electrical topology 1000. Topology 1000 exemplifies the numerous ways in which a piezoelectric generator or array be utilized.

Piezoelectric generator(s)/array(s) may be coupled to an energy regulation circuit 1003. Such a regulation circuit may sense the polarity that a generator/array (e.g., piezoelectrics 1001 and 1002) is producing and direct it to an appropriate storage device 1004 (e.g., battery or capacitor). Regulation circuit 1003 may include any type of amplification, modulation, or conversion circuitry needed. Regulation circuitry 1003 may also control how piezoelectrics 1001 and 1002 are coupled together (and when piezoelectrics 1001 and 1002 are coupled together). If the polarity of electrical energy from piezoelectric array(s)/generator(s) 1001 and 1002 alternates in a steady manner then circuitry 1003 may include an AC/DC converter. If the polarity of electrical energy from piezoelectrics 1001 and 1002 does not change then, for example, circuitry 1003 may include a DC/AC converter.

A secondary power supply (not shown) may be coupled to circuitry 1003 (or any other circuitry/device of topology 1000) in order to supply back-up or primary power to topology 1000 or an external device.

Energy storage device 1004 may be included in topology 1000 and may store the electrical energy produced by piezoelectrics 1001 and 1002, provide electrical energy to piezoelectrics 1001 and 1002 (e.g., when mechanical distortion is needed), or act as a power supply to the other elements of topology 1000 (e.g., memory 1011 and processor 1005). Input/Output terminals may be included in order to connect external devices. For example, a power supply may be coupled to input device 1012 in order to repolarize piezoelectrics 1001 and 1003. Alternatively, a battery or device may be coupled to output device 1012 in order to use the electrical energy generated from piezoelectrics 1001 and/or 1002 or energy storage device 1004.

Control processor 1005 may be included and may provide control signals from/to, or route signals between, the components of topology 1000 (or external devices). A variety of devices may be coupled to control circuitry 1005.

Environmental control system 1006 may be included. System 1006 may, for example, be a heater. Such a heater could be utilized in self-heating clothing. System 1006 may, as per another example, be a cooler. Such a cooler could be utilized in self-cooling clothing.

Positioning system 1007 may be included in topology 1000. Positioning system 1007 may be, for example, a Global Positioning System (GPS) system. Thus, a shoe may include a GPS system that transmits or records a position every time a shoe impacts the ground. In military applications, this could be utilized with piezo sensors/generators in clothing (e.g., a bullet proof vest) to determine when and where (both on a battle ground and on the body) a wound was sustained. For example, a bullet proof vest may include a variety of piezo sensors, or a variety of other sensors (e.g., an array of wires conducting electricity such that a bullet strike severs at least one electrical connection of conducting wires, i.e., creates an open connection, to control circuitry), to determine where on the vest a bullet strikes. Such a vest, or other clothing, would allow an off-site doctor to immediately know what type of wound was sustained and, therefore, react faster to suggesting/providing helpful medical assistance. Piezo sensors, however may be utilized to also determine the angle, strength, and the shaping of at least the tip of a bullet that entered the vest.

Communications system 1008 may be included in topology 1000 to communicate data from a remote (e.g., wireless) device to topology 1000, or vise versa. Such a communications system 1008 may be wireless. For example, communications system 1008 may be a radio, WiFi, infrared, wireless LAN (e.g., modem), or cellular communications system. Such a communications system 1008 may be non-wireless. For example, communications system 1008 may be a telephone, optical transmitter/receiver coupled to an optical line, or modem.

A display 1009 may be included in topology 1000 to display data from the components of topology 1000 or, for example, components external to topology 1000. Display 1009, or any component of 1000, may include additional input/output/interface terminals/controls.

Any type of circuit or device may be coupled to topology 1000. Component 1010 symbolizes such circuit or device. Memory 1011 may also be included in topology 1000. Such memory may be used to store commands/data received from any component of topology 1000 (or a component external to topology 1000).

Person skilled in the art will appreciate that a number of configurations may be incorporated in topology 1000. For example, a device (e.g., an LED) may be directly coupled to piezoelectrics 1001 and/or 1002.

Figure 11:
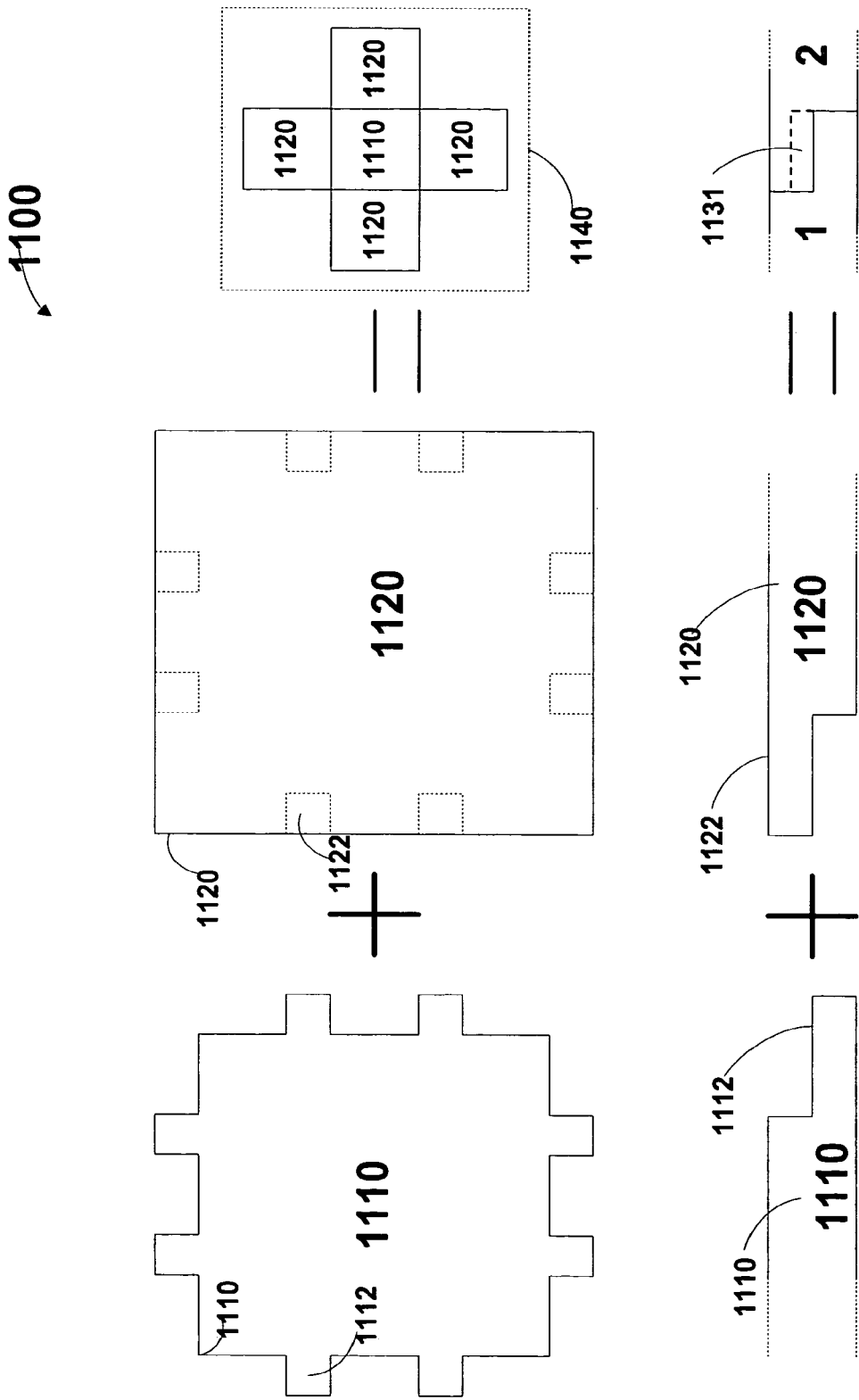
FIG. 11 is an illustration of piezoelectric generator arrays integrated into tiles constructed in accordance with the principles of the present invention.

FIG. 11 shows tile structures 1100 that may be used, for example, in a shoe, road, or sidewalk. Tile 1110 may include, for example, one or more male connectors 112. Each male connectors may include one or more electrodes (e.g., one or more positive and/or negative electrode). Such a tile 1110 may electrically couple to tile 1020. Tile 1020 may include female connectors 1122. Each female connectors 1122 may include one or more electrodes (e.g., one or more positive and/or negative electrode). A cushion, or gap, 1131 may be provided between tiles 1110 and 1120 when coupled together such that a force on a single tile 1110 or 1120 will not disturb surrounding tiles. Alternatively, tiles 1110 and 120 may be directly coupled together such that a force on one tile may be distributed amongst adjacently coupled tiles. One tile configuration is shown in configuration 1140. The electrodes of tiles 1110 and 1120 may be utilized to electrically couple the piezo generators/arrays of tiles 1110 and 1120 together.

Figure 12:
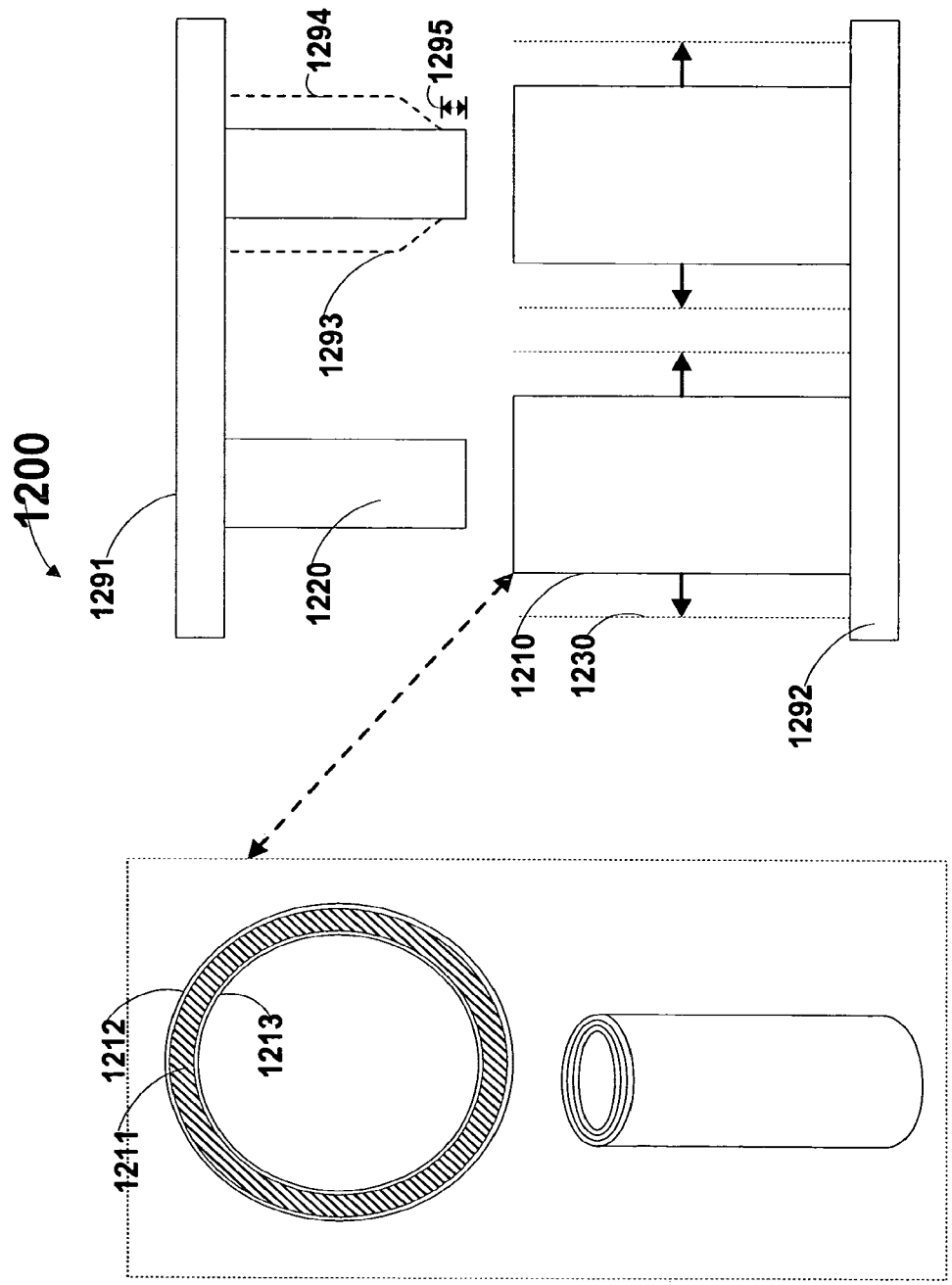
FIG. 12 is an illustration of tube-shaped piezoelectric generator arrays constructed in accordance with the principles of the present invention.

FIG. 12 shows other piezoelectric geometries that may be utilized in accordance with the principles of the present invention. FIG. 12 shows piezoelectric array 1200 that includes multiple tube-shaped piezo generators 1210. Piezo generator 1210 may include, for example, piezoceramic element 1211, electrode 1212, and electrode 1213. The electrodes of piezo generators 1210 may be coupled in a variety of ways (e.g., in a parallel or series configuration). When teeth 1220 are inserted into tubes 1210, tubes 1210 preferably expand (e.g., expand to dimensions 1230) and generate an electrical potential. A cushion may be provided in the center of tube 1210 (and/or surrounding teeth 1200) in order to decrease wear on tube piezos 1210. For example, a cushion (not shown), such as a foam, may be provided on teeth 1220 and inside tube piezos 1210. These two cushions may be glued together such that teeth 1220 is always properly aligned with the opening of tube piezo 1210. Piezo arrays 1200 may be utilized, for example in a shoe or underneath a roadway/walkway. Hemispheres piezos may also be utilized in lieu of tubes 1210. In such an example, teeth 1220 may also have a hemisphere shape although many shapes would still allow the piezo array to operate. Teeth 1220 and tubes 1210 may be coupled to substrate 1291 and 1292, respectively. Substrates 1291 and 1292 may be, for example, an upper and lower portion of a tile (e.g., an upper and lower layer of ceramic for tile 1110) of FIG. 11. Similarly, substrates 1291 and 1292 may be a fabric or may be shoe layers (e.g., a cushion/foam/rubber/flexible layer of a shoe).

Apertures (route) may exist in substrates 1291 and 1292 to help route wiring. For example, one or more aperture may be included on the portions of substrate 1292 aligned with the apertures of tubes 1210 such that the inner electrodes of the tubes (e.g., electrodes 1213) may be coupled together.

Lines 1293 and 1294 define an alternative shape for a tooth of the present invention. The bottom of the shape may have a diameter that would fit into tube 1210. Alternatively, a length of the tooth, e.g., portion 1295, may be fabricated to fit into tube 1210. Such a portion 1295 may substantially permanently reside in tube 1210 such that tube 1210 and a tooth have a higher degree of being properly aligned. An aperture (not shown) may be included on substrate 1292 may be fabricated to receive portion 1295 such that a higher amount of stress may be placed on tube 1210. The diameter of such a tooth defined by lines 1293 and 1294 preferably is fabricated such that tube 1210 approximately distorts to its maximum diameter (e.g., diameter 1230). A liquid or cushion (e.g., a foam or any other flexible or low density material) may be placed around tubes 1210 such that when tooth 1220 is removed from tube 1210 a force is exerted against tube 1210 to more quickly bring tube 1210 back to its ambient diameter (e.g., the diameter tube 1210 is illustrated as) from its displaced diameter (e.g., diameter 1230).

From the foregoing description, persons skilled in the art will recognize that this invention provides piezoelectrics that may be utilized as sensors, power supplies, and actuators. In addition, persons skilled in the art will appreciate that the various configurations described herein may be combined without departing from the present invention. For example, spring 599 may be included inside of a piezo tube (e.g., piezo tube 1210 of FIG. 1200) such that after a force is removed from a guide-tooth inserted into the piezo tube, the spring forces the guide-tooth out of the piezo tube. It will also be recognized that the invention may take many forms other than those disclosed in this specification. Accordingly, it is emphasized that the invention is not limited to the disclosed methods, systems and apparatuses, but is intended to include variations to and modifications therefrom which are within the spirit of the following claims.

What is claimed is:

1. A wearable structure comprising:
a first generator array having a plurality of first generators separated by a plurality of isolation layers, wherein said plurality of isolation layers have a lower stiffness than said plurality of first generators, said first generators are located about a first portion of said wearable structure, wherein at least a portion of a first one of said plurality of first generators is operable to be mechanically distorted by a side of at least one tooth in order to provide a first electrical energy, wherein said first electrical energy is provided to an energy storage device and at least a portion of said side includes a curvature; and
a second generator array located about a second portion of said wearable structure, wherein said second generator array is operable to be mechanically distorted in order to provide a second electrical energy, and said second electrical energy is provided to said energy storage device.

2. The wearable structure of claim 1, wherein said first generator array comprises a piezoelectric generator array.

3. The wearable structure of claim 1, wherein said second generator array comprises a piezoelectric generator array.

4. The wearable structure of claim 1, wherein said first generator array comprises a first piezoelectric generator array and said second generator array comprises a second piezoelectric generator array.

5. The wearable structure of claim 1, further comprising a third generator array.

6. The wearable structure of claim 1, further comprising:
a third generator array; and
a fourth generator array.

7. The wearable structure of claim 1, wherein said first generator array comprises a bending generator array.

8. The wearable structure of claim 1, wherein said second generator array comprises a compression generator array.

9. The wearable structure of claim 1, wherein said second generator array comprises a bending generator array.

10. The wearable structure of claim 1, wherein said second generator array comprises a generator including a first metal layer, a piezoceramic layer, and a second metal layer.

11. The wearable structure of claim 1, wherein said second generator array comprises a generator including a piezoceramic layer.

12. The wearable structure of claim 1, wherein said second generator array comprises a plurality of second generators isolated by a plurality of second isolation layers.

13. The wearable structure of claim 1, wherein said wearable structure is a shoe and a third generator array is located about a heel of said shoe, wherein said third generator array is operable to be mechanically distorted in order to provide a third electrical energy.

14. The wearable structure of claim 1, wherein said wearable structure is a shoe and a third generator array is located about a heel of said shoe, wherein said third generator array is operable to be mechanically distorted in order to provide a third electrical energy and said third generator array comprises a compression generator array.

15. The wearable structure of claim 1, wherein the wearable structure is a shoe and a third generator array is located about a heel of said shoe, wherein said third generator array is operable to be mechanically distorted in order to provide a third electrical energy and said third generator array comprises a plurality of conductive layers.

16. Wearable structure of claim 1, wherein said second generator array comprises a generator including a first conductive layer, a second conductive layer, and a piezoceramic layer.

17. Wearable structure of claim 1, wherein said second generator array comprises a generator including a first conductive layer and a second conductive layer.

18. Wearable structure of claim 1, wherein at least a second one of said plurality of first generators is operable to be mechanically distorted by at least one second tooth in order to provide a third electrical energy.

19. The wearable structure of claim 1, wherein at least a second one of said plurality of first generators is operable to be mechanically distorted by at least one second tooth in order to provide a third electrical energy.

20. The wearable structure of claim 1, wherein at least a second one of said plurality of first generators is operable to be mechanically distorted by at least one second tooth in order to provide a third electrical energy and said third electrical energy is provided to said energy storage device.

* * * * *